US008646174B2

(12) United States Patent
Kaida et al.

(10) Patent No.: US 8,646,174 B2
(45) Date of Patent: Feb. 11, 2014

(54) DEVICE AND METHOD FOR MOUNTING ELECTRONIC COMPONENTS

(75) Inventors: Kenichi Kaida, Osaka (JP); Hideki Sumi, Yamanashi (JP); Masahiro Kihara, Yamanashi (JP); Kenichirou Ishimoto, Yamanashi (JP); Noboru Higashi, Yamanashi (JP)

(73) Assignee: Panasonic Corporation, Osaka (JP)

( * ) Notice: Subject to any disclaimer, the term of this patent is extended or adjusted under 35 U.S.C. 154(b) by 56 days.

(21) Appl. No.: 13/381,245

(22) PCT Filed: May 7, 2010

(86) PCT No.: PCT/JP2010/003147
§ 371 (c)(1),
(2), (4) Date: Dec. 28, 2011

(87) PCT Pub. No.: WO2011/001583
PCT Pub. Date: Jan. 6, 2011

(65) Prior Publication Data
US 2012/0102726 A1    May 3, 2012

(30) Foreign Application Priority Data
Jun. 29, 2009 (JP) .................................. 2009-153379

(51) Int. Cl.
*H05K 3/30* (2006.01)
*H05K 3/20* (2006.01)

(52) U.S. Cl.
USPC .................................. 29/832; 29/831; 29/833

(58) Field of Classification Search
USPC .......................... 29/832, 831, 833, 739, 740
See application file for complete search history.

(56) References Cited

U.S. PATENT DOCUMENTS

| | | | | |
|---|---|---|---|---|
| 5,079,834 A | * | 1/1992 | Itagaki et al. | 29/840 |
| 5,787,577 A | * | 8/1998 | Kent | 29/833 |
| 6,094,808 A | * | 8/2000 | Mimura et al. | 29/743 |
| 6,594,887 B1 | * | 7/2003 | Okuda et al. | 29/739 |
| 6,807,726 B2 | * | 10/2004 | Iisaka et al. | 29/740 |

(Continued)

FOREIGN PATENT DOCUMENTS

| | | |
|---|---|---|
| JP | 2005-005290 A | 1/2005 |
| JP | 2006-319332 A | 11/2006 |
| JP | 2007-335524 A | 12/2007 |

OTHER PUBLICATIONS

International Search Report for PCT/JP2010/003147 dated Jun. 15, 2010.

*Primary Examiner* — David Angwin
(74) *Attorney, Agent, or Firm* — Pearne & Gordon LLP

(57) ABSTRACT

An object is to provide an electronic component mounting method in which an adequate component mounting work to which a check result is correctly reflected is enabled and it is possible to satisfy both reduction of the failure occurrence rate and improvement of the working efficiency. An electronic component mounting apparatus in which an appearance checking section which checks a board to detect existence or non-existence of a failure item, and a component mounting section which transfers and mounts an allocated mounting object component to the board in which the check is ended are integrally disposed includes a mounting availability determination processing section 28*d* which determines an availability of an execution of an operation of mounting the mounting object component, based on a result of detection of a failure item. In a mounting availability determining process, an availability of an execution of a mounting operation for the mounting object component is automatically determined based on preset failure patterns of the detection result.

1 Claim, 6 Drawing Sheets

(56) References Cited

U.S. PATENT DOCUMENTS

| | | | |
|---|---|---|---|
| 6,860,002 B2 * | 3/2005 | Oyama | 29/740 |
| 6,874,225 B2 * | 4/2005 | Haji et al. | 29/740 |
| 6,968,610 B2 * | 11/2005 | Nagao et al. | 29/740 |
| 7,003,872 B2 * | 2/2006 | Mimura et al. | 29/832 |
| 7,032,299 B2 * | 4/2006 | Arase et al. | 29/740 |

* cited by examiner

DEVICE AND METHOD FOR MOUNTING ELECTRONIC COMPONENTS

TECHNICAL FIELD

The present invention relates to an electronic component mounting apparatus and electronic component mounting method in which electronic components are mounted on a board carried in from an upstream apparatus based on a result of inspection of the state of the board.

BACKGROUND ART

An electronic component mounting line which mounts electronic components onto a board is configured by coupling a plurality of electronic component mounting apparatuses to each other. A board onto which mounting is to be performed passes through the electronic component mounting apparatuses from upstream side to the downstream side, so that electronic components are sequentially mounted onto the board. The board onto which components have been mounted is sent to a reflow apparatus in order to be subjected to solder bonding. Depending on the kind of the board, in advance of the solder bonding, it is necessary to perform an appearance check on the board onto which components have been mounted. The appearance check is performed by taking an image of the electronic components on the board. In the case where the upper sides of already mounted components are covered by a shield case, stack components, or the like and then new electronic components are to be mounted, therefore, an appearance check against the already mounted components must be performed before the mounting of the new electronic components.

In the case where electronic components which are essentially required to be subjected to an appearance check exist in the electronic components to be covered by a shield case, stack components, or the like, therefore, a checking apparatus for an appearance check is placed upstream from an electronic component mounting apparatus which mounts these components (see Patent Reference 1). The prior art example shown in the Patent Reference has a configuration where the checking apparatus MC is placed upstream from the electronic component mounting apparatus MD which mounts a shield case.

PRIOR ART REFERENCE

Patent Reference

Patent Reference 1: JP-A-2005-5290

SUMMARY OF THE INVENTION

Problems that the Invention is to Solve

In a configuration example where a checking apparatus is placed upstream from an electronic component mounting apparatus as in the above-describe prior art example, however, the following trouble occurs. Namely, a board which is determined by the checking apparatus that the component mounting state is good is transported to the electronic component mounting apparatus in the downstream side. In the transporting process, already mounted components do not always maintain the normal state, and positional displacement of the components may be sometimes caused by vibrations transmitted during transporting or waiting in the line.

Namely, even when it is determined in the check that the component mounting state is satisfactory, the already mounted components are not always in the normal state at the timing when a shield case, stack components, or the like is overlappingly mounted in the downstream electronic component mounting apparatus. Therefore, a situation where the shield case, the stack components, or the like is overlappingly mounted while the already mounted components remain in an abnormal state sometimes occurs, with the result that a mounting failure may be caused. In order to avoid such a situation, a board which is determined to be a failure by the upstream checking apparatus is taken out from the mounting line, and a repairing work must be performed off-line while referring to a result of the check. As described above, in a conventional electronic component mounting line, an adequate component mounting work to which a check result is correctly reflected is difficult to be efficiently executed, and it is requested to satisfy both reduction of the failure occurrence rate and improvement of the working efficiency.

Therefore, it is an object of the invention to provide an electronic component mounting method in which an adequate component mounting work to which a check result is correctly reflected is enabled, and it is possible to satisfy both reduction of the failure occurrence rate and improvement of the working efficiency.

Means for Solving the Problems

The electronic component mounting apparatus of the invention is an electronic component mounting apparatus which mounts electronic components on a board based on a result of a check of a state of the board, wherein the apparatus includes: a board transporting mechanism which transports the board to position and hold the board at a predetermined working position; an appearance checking section which compares a recognition process result that is obtained by performing a recognition process on imaged data obtained by taking an image of the board positioned at the working position, with a preset failure detection criterion, thereby detecting existence or non-existence of a failure item in the board, and which outputs a result of the detection; a component mounting section which transfers and mounts a mounting object component that is an electronic component allocated to the electronic component mounting apparatus, onto the board which is positioned at the working position, and in which the check by the appearance checking section is ended; and a mounting availability determination processing section which determines an availability of an execution of an operation of mounting the mounting object component by the component mounting section, based on the detection result, the failure item includes: a first failure pattern which, in a case where the mounting object component is to be mounted while covering at least partially an upper side of one of electronic components which are already mounted on the board, corresponds to a case where, in a case where an electronic component which is other than the covered components that are to be covered by the mounting object component, and which is originally to be mounted does not exist or is positionally displaced from a normal position while exceeding an allowable range, an operation of supplementarily mounting the electronic component or correcting a position in a subsequent step is not disturbed by mounting the mounting object component; a second failure pattern which corresponds to a case where one of the covered components of the electronic components which are already mounted does not exist or is positionally displaced from the normal position while exceeding the allowable range; and a third failure pattern which corresponds to a case where a foreign material that disturbs an operation of mounting the mounting object component exists, and, when the first failure pattern is detected, the mounting availability determining section determines that the execution of the mounting operation for the mounting object component by the component mounting section is available, and, when the second failure pattern or the third failure pattern is detected, determines that the execution of the mounting operation for the mounting object component by the component mounting section is impossible.

The electronic component mounting method of the invention is an electronic component mounting method in which electronic components are mounted on a board based on a result of a check of a state of the board, wherein the method includes: a board transporting step of transporting the board to position and hold the board at a predetermined working position; an appearance checking step of comparing a recognition process result that is obtained by performing a recognition process on imaged data obtained by taking an image of the board positioned at the working position, with a preset failure detection criterion, thereby detecting existence or non-existence of a failure item in the board, and outputting a result of the detection; a component mounting step of transferring and mounting a mounting object component that is an electronic component allocated as a mounting object to the electronic component mounting apparatus, onto the board which is positioned at the working position, and in which the check in the appearance checking step is ended; and a mounting availability determining step of determining an availability of an execution of an operation of mounting the mounting object component, based on the detection result in advance of the component mounting step, the failure item includes: a first failure pattern which, in a case where the mounting object component is to be mounted while covering at least partially an upper side of one of electronic components which are already mounted on the board, corresponds to a case where, in a case where an electronic component which is other than the covered components that are to be covered by the mounting object component, and which is originally to be mounted does not exist or is positionally displaced from a normal position while exceeding an allowable range, an operation of supplementarily mounting the electronic component or correcting a position in a subsequent step is not disturbed by mounting the mounting object component; a second failure pattern which corresponds to a case where one of the covered components of the electronic components which are already mounted does not exist or is positionally displaced from the normal position while exceeding the allowable range; and a third failure pattern which corresponds to a case where a foreign material that disturbs an operation of mounting the mounting object component exists, and, when the first failure pattern is detected, it is determined in the mounting availability determining step that the execution of the mounting operation for the mounting object component in the component mounting step is available, and, when the second failure pattern or the third failure pattern is detected, it is determined that the execution of the mounting operation for the mounting object component in the component mounting step is impossible.

Effects of the Invention

According to the invention, the apparatus includes: the appearance checking section which takes an image of the board positioned at the working position, which detects existence or non-existence of a failure item in the board, and which outputs a result of the detection; a component mounting section which transfers and mounts a mounting object component that is an electronic component allocated to the electronic component mounting apparatus, onto the board in which the check by the appearance checking section is ended; and a mounting availability determination processing section which determines an availability of an execution of an operation of mounting the mounting object component by the component mounting section, based on the detection result, and an availability of an execution of a mounting operation for the mounting object component is automatically determined based on preset failure patterns of the detection result, whereby an adequate component mounting work to which a check result is correctly reflected is enabled, and both reduction of the failure occurrence rate and improvement of the working efficiency can be satisfied.

MODE FOR CARRYING OUT THE INVENTION

Figure 1:
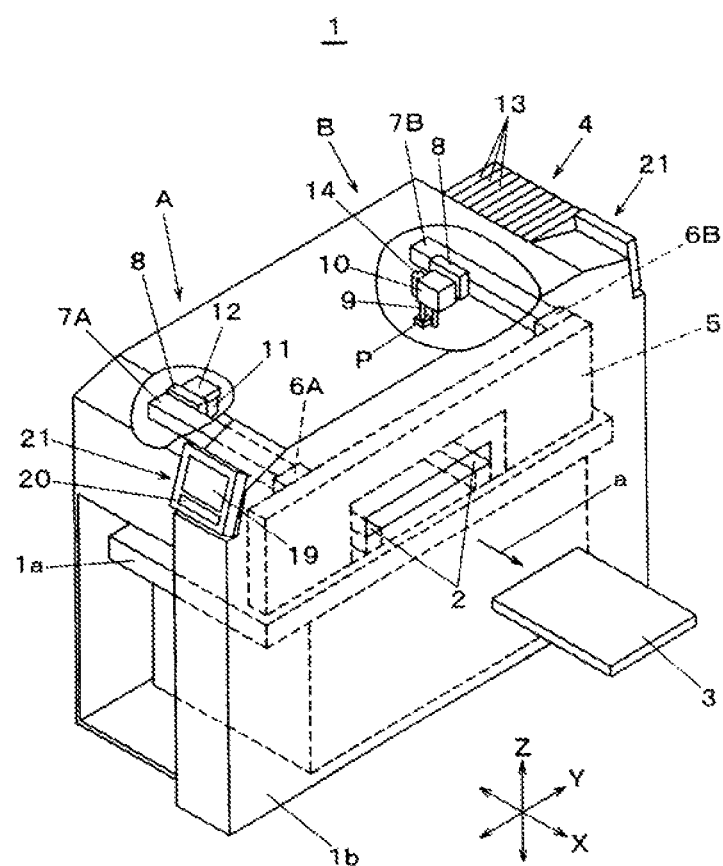
FIG. 1 is a perspective view of an electronic component mounting apparatus of an embodiment of the invention.
Figure 2:
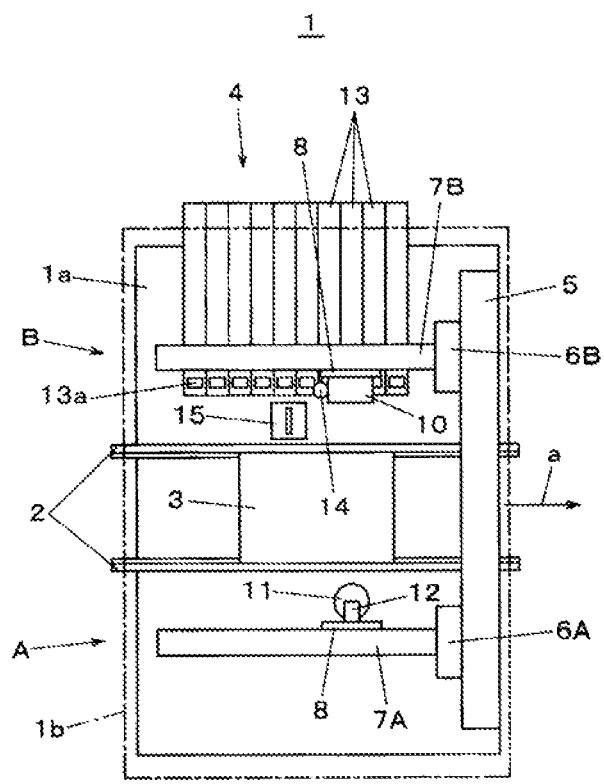
FIG. 2 is a plan view of the electronic component mounting apparatus of the embodiment of the invention.

Next, an embodiment of the invention will be described with reference to the drawings. Referring to FIGS. 1 and 2, an electronic component mounting apparatus 1 constitutes an electronic component mounting line in which a plurality of apparatuses such as a screen printing apparatus and an electronic component mounting apparatus are coupled to each other, and has a functions of, based on a result of a check of a state of a board delivered from another electronic component mounting apparatus which is an upstream apparatus, mounting electronic components on the board. In some cases, a board 3 in a state where components have been mounted by an upstream apparatus is delivered, and, in other cases, a board onto which components have not been mounted is delivered.

The electronic component mounting apparatus 1 includes a transporting conveyor 2 which is a board transporting mechanism, on a platform 1a in a cover member 1b. The transporting conveyor 2 transports the delivered board 3 in a constant horizontal direction (the direction of the arrow a (X direction)), and positions and holds the board at a predetermined working position. In the front side (in the lower side in FIG. 2) of the transporting conveyor 2, an appearance checking section A is disposed, and, in the rear side (in the upper side in FIG. 2), a component mounting section B is disposed. The appearance checking section A has a function of comparing a recognition process result that is obtained by performing a recognition process on imaged data obtained by taking an image of the board 3 positioned at the working position in the transporting conveyor 2, with a preset failure detection criterion, thereby detecting existence or non-existence of a failure item in the board 3, and outputting a result of the detection.

The component mounting section B has a function of transferring and mounting a mounting object component that is an electronic component allocated as a mounting object to the electronic component mounting apparatus 1, onto the board 3 which is positioned at the working position in the transporting conveyor 2, and in which the check by the appearance checking section A is ended.

Hereinafter, the configurations of the appearance checking section A and the component mounting section B will be specifically described. A Y-axis table 5 which extends in a direction (Y-axis direction) that is horizontally perpendicular to the transporting direction (X-axis direction) of the board 3 by the transporting conveyor 2 is disposed above the transporting conveyor 2. In the Y-axis table 5, two Y-axis sliders 6A, 6B are disposed so as to be movable along the Y-axis table 5 (i.e., in the Y-axis direction), and one ends of X-axis tables 7A, 7B which extend in the X-axis direction are attached to the Y-axis sliders 6A, 6B, respectively. Moving stages 8 which are movable in the X-axis direction are disposed in the X-axis tables 7A, 7B, respectively.

A camera head 12 including a recognition camera 11 having a posture in which the imaging visual field is downward directed is attached through the moving stage 8 to the X-axis table 7A constituting the appearance checking section A. The Y-axis table 5 and the X-axis table 7A constitute a camera moving mechanism 23 (see FIG. 4) which moves the recognition camera 11 in the horizontal direction. When the camera moving mechanism 23 is driven, the recognition camera 11 can be moved to an arbitrary position above the board 3 that is carried in from the upstream apparatus to the transporting conveyor 2, and that is positioned at a working position, and can take an image of the board 3 from the upper side. Then, a result of the imaging is subjected to a recognition process by a recognition processing section 28a (see FIG. 4), whereby the mounting states of electronic components on the board 3 are detected.

A mounting head 10 including a plurality of suction nozzles 9 is attached through the moving stage 8 to the X-axis table 7B constituting the component mounting section B. The Y-axis table 5, the X-axis table 7B, and the mounting head 10 constitute a component mounting mechanism 24 (see FIG. 4) which mounts components onto the board 3. When the component mounting mechanism 24 is driven, a component P (see FIG. 1) is taken out by the mounting head 10 from a component supplying section 4 which is placed in the lateral side of the component mounting section B, and mounted onto the board 3 in which the check by the appearance checking section A has been ended. A board recognition camera 14 is disposed integrally with the mounting head 10. The board recognition camera 14 which is moved together with the mounting head 10 above the board 3 recognizes a component mounting position of the board 3. A component recognizing camera 15 is placed on a moving path of the mounting head between the component supplying section 4 and the transporting conveyor 2. The component recognizing camera 15 recognizes the component P in the state where the component is sucked and held by the suction nozzles 9.

In the component supplying section 4, a tape feeder 13 which supplies relatively small-sized components that are held on a carrier tape, such as chip components, a tray feeder (not shown) which supplies a large component in a state where it is accommodated in a tray, such as a shield case that is to be mounted while covering components which have been already mounted onto the board 3 in the previous step, and the like are placed. In the embodiment, an example in the case where a mounting object component that is allocated to the electronic component mounting apparatus 1 is a shield case (see shield cases 32A, 32B shown in FIG. 3) will be described.

Referring to FIGS. 1 and 2, an operation panel 21 including a display 19 and an inputting section 20 is disposed on the cover member 1b. A result of the check by the appearance checking section A, that of the determination on whether the component mounting by the component mounting section B is possible or not, based on the check result, and the like are displayed on the display 19. Then, the operator of the electronic component mounting apparatus 1 can perform a required inputting operation through the inputting section 20 while seeing an image displayed on the display 19.

Figure 3:
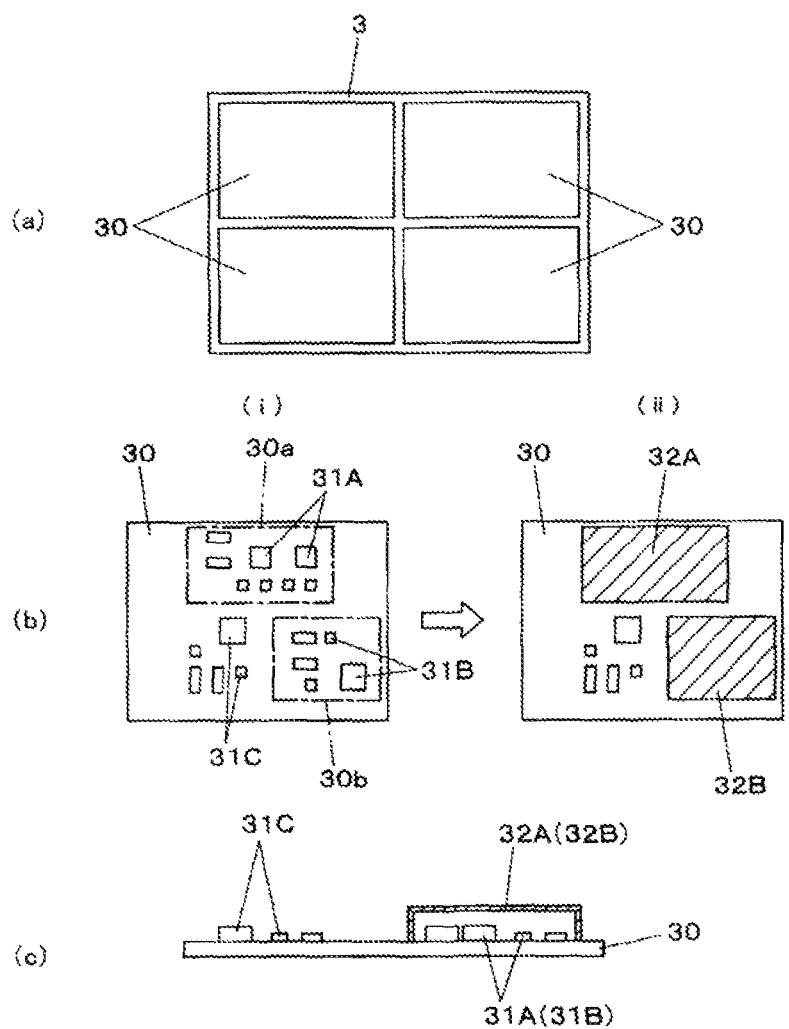
FIG. 3 In the figure, (a), (b), and (c) are views illustrating a board on which mounting is to be performed in the electronic component mounting apparatus of the embodiment of the invention.

Referring to FIG. 3, the board 3 which is an object of working by the electronic component mounting apparatus 1 will be described. As shown in FIG. 3(a), the board 3 is a multi-piece board in which a plurality (here, four) of identical individual boards 30 are assembled into one sheet. In the electronic component mounting apparatus 1, the same work is executed on each of the individual boards 30.

FIG. 3(b) shows the contents of the work executed by the electronic component mounting apparatus 1. FIG. 3(b)(i) shows the individual board 30 in a state where the board is carried into the electronic component mounting apparatus 1. In the individual board 30, shield areas 30a, 30b indicated by the dashed-dotted line frames are mounting portions on which the shield cases 32A, 32B are to be mounted in the electronic component mounting apparatus 1. In the upstream apparatus which performs the previous step, a plurality of already mounted components 31A, 31B are mounted in the shield areas 30a, 30b, and, in the individual board 30, a plurality of already mounted components 31C are mounted in the range other than the shield areas 30a, 30b.

The individual board 30 in this state is the object of the check by the appearance checking section A, and the component mounting by the component mounting section B is executed based on a result of the check.

Namely, in the case where a failure is not detected in the mounting states of the already mounted components 31A, 31B in the shield areas 30a, 30b, the shield cases 32A, 32B are mounted in positions corresponding to the shield areas 30a, 30b as shown in FIG. 3(b)(ii). As shown in FIG. 3(c), therefore, the already mounted components 31A, 31B become a state where the components are covered by the shield cases 32A, 32B that are lately mounted. The already mounted components 31C remain in the state where their upper sides are uncovered and exposed in the individual board 30.

Figure 4:
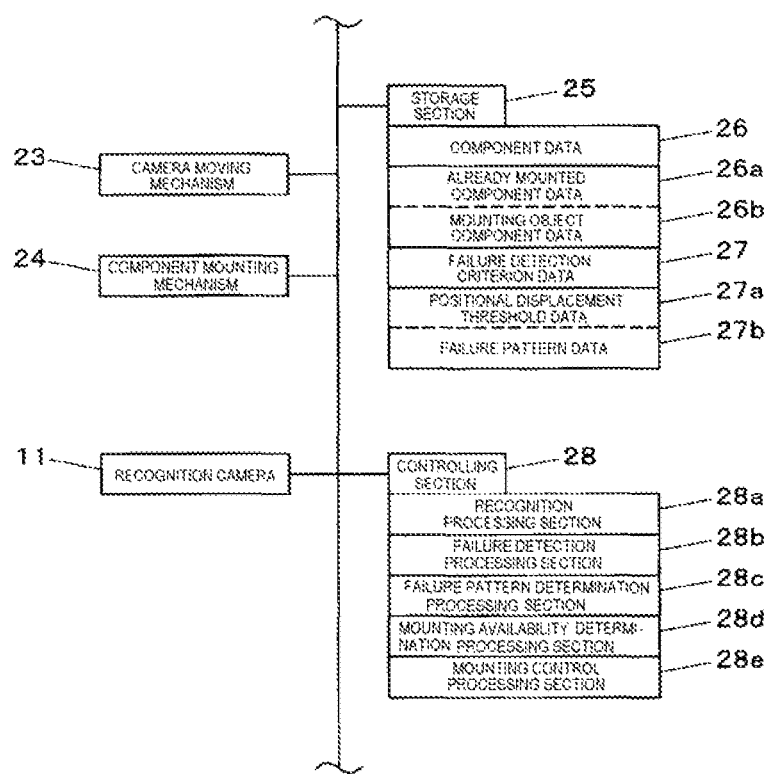
FIG. 4 is a block diagram showing the configuration of a control system of the electronic component mounting apparatus of the embodiment of the invention.

With reference to FIG. 4, next, the configuration of a control system will be described. Referring to FIG. 4, a controlling section 28 controls the camera moving mechanism 23, the component mounting mechanism 24, and the recognition camera 11, based on various data stored in a storage section 25, whereby working operations in the electronic component mounting apparatus 1 are performed.

The storage section 25 stores component data 26 containing already mounted component data 26a and mounting object component data 26b, and failure detection criterion data 27 containing positional displacement threshold data 27a and failure pattern data 27b. The already mounted component data 26a are data indicating components which, in the state where the board is delivered to the electronic component mounting apparatus 1, have been already mounted onto the board 3 by the upstream apparatus. The mounting object component data 26b are data identifying components which are as mounting objects allocated to the electronic component mounting apparatus 1. Based on the mounting object component data 26*b*, the component mounting is performed on the board 3 by the component mounting mechanism 24.

The failure detection criterion data 27 are data which are used in detection of a failure of the mounting state that is performed by the appearance checking section A. Namely, the positional displacement threshold data 27*a* define a tolerance of a positional displacement amount from the normal position of a component which is detected by image recognition. The failure pattern data 27*b* define patterns of failure occurrence modes which are assumed in each individual board 30 of the board 3.

Figure 5:
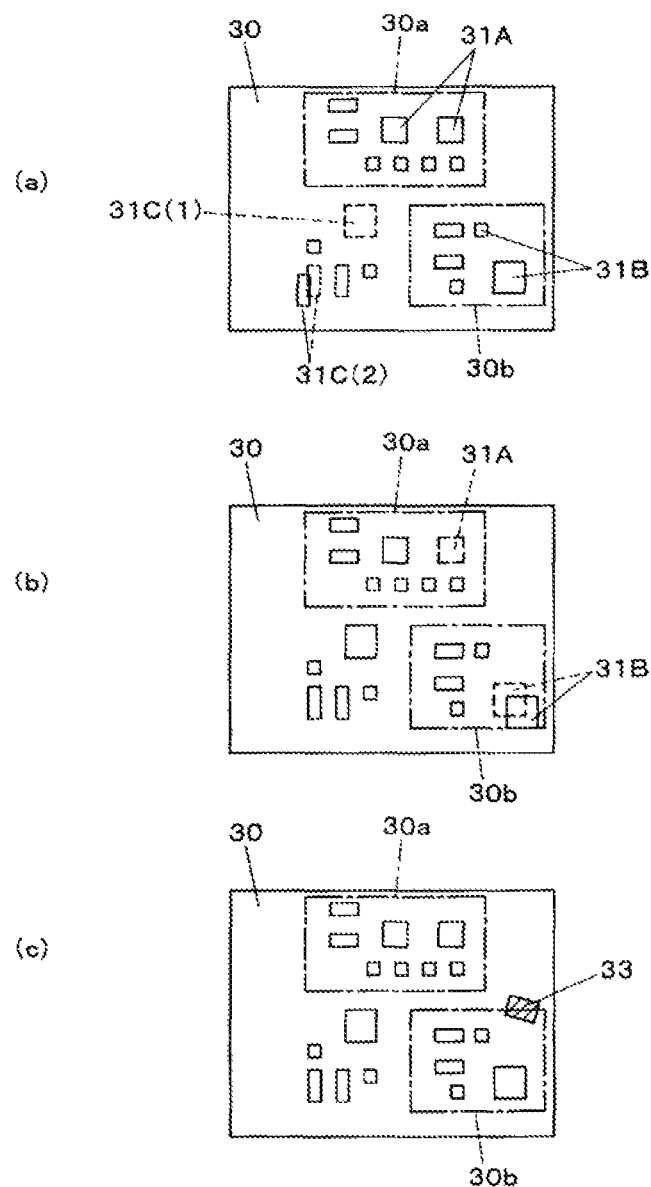
FIG. 5 In the figure, (a), (b), and (c) are views illustrating a failure pattern in an electronic component mounting method of the embodiment of the invention.

Referring to FIG. 5, an example of failure patterns defined in the failure pattern data 27*b* will be described. In the electronic component mounting apparatus 1 shown in the embodiment, a failure pattern is shown which is produced in the case where mounting object components are the shield cases 32A, 32B and mounted in a form that the shield cases cover the already mounted components 31A, 31B that are mounted onto the board 3 by the upstream apparatus. The failure pattern which is defined here can be applied not only to the case where already mounted electronic components are completely covered as in the case of the shield cases 32A, 32B, but also to that where the upper side of any one of already mounted electronic components is at least partially covered.

First, FIG. 5(*a*) shows a state where, in the shield areas 30*a*, 30*b* of the individual board 30, the already mounted components 31A, 31B are normally mounted, and a failure is not detected, but a failure is detected with respect to the already mounted components 31C which are mounted in the range other than the shield areas 30*a*, 30*b*. Here, two kinds of failure examples are exemplified with respect to two already mounted components 31C(1), (2). With respect to the already mounted component 31C(1), an example is shown in which a component that is originally to be mounted does not exist because of a mounting error in the previous step, and, with respect to the already mounted component 31C(2), an example is shown in which a component is mounted but positionally displaced from the normal position while exceeding the allowable range. In the case where such a failure is detected, the already mounted components 31C are supplementarily mounted or positionally corrected in a subsequent step, whereby the normal individual board 30 can be completed. Therefore, the shield cases 32A, 32B may be mounted by the component mounting section B.

Namely, the failure pattern shown in FIG. 5(*a*) is a first failure pattern corresponding to a case where, in a case where the already mounted component 31C which is other than the already mounted components 31A, 31B that are covered components that are covered by the shield cases 32A, 32B that are the mounting object components, and which is originally to be mounted does not exist or is positionally displaced from a normal position while exceeding an allowable range, an operation of supplementarily mounting the already mounted component 31C or correcting a position in a subsequent step is not disturbed by mounting the shield cases 32A, 32B.

Next, FIG. 5(*b*) shows an example in which the already mounted component 31A that is originally to be mounted in the shield area 30*a* does not exist because of a mounting error in the previous step, and an example in which the already mounted component 31B is mounted in the shield area 30*b* but positionally displaced from a normal position while exceeding an allowable range. Namely, the failure pattern shown in FIG. 5(*b*) is a second failure pattern corresponding to a case where one of the already mounted components 31A, 31B that are the covered components of the electronic components which are already mounted does not exist or is positionally displaced from the normal position while exceeding the allowable range. In the second failure pattern, when the shield cases 32A, 32B are mounted as they are, it is impossible to supplementarily mount the already mounted component 31A or correct the position of the already mounted component 31B in a subsequent step, and hence the shield cases 32A, 32B cannot be mounted by the component mounting section B.

Furthermore, FIG. 5(*c*) shows an example in which a certain foreign material 33 that disturbs the operation of mounting the shield case 32B is detected in the portion where the shield case 32B is to be mounted. Namely, the failure pattern shown in FIG. 5(*c*) is a third failure pattern corresponding to a case where the foreign material 33 that disturbs the operation of mounting the shield case 32B that is the mounting object component exists. In the third failure pattern, the normal operation of mounting the shield case 32B is disturbed, and therefore the shield case 32B cannot be mounted by the component mounting section B.

The first to third failure patterns shown in FIG. 5 exemplify a failure item which, in the embodiment where a mounting object component is mounted onto the board 3 having an already mounted component that is previously mounted by the upstream apparatus, in a manner that the already mounted component is covered, is detected by the appearance checking section A. Depending on the kinds of the already mounted component and the mounting object component, therefore, various failure patterns other than the three above-described failure patterns may be assumed. With respect to each of the failure patterns, the determination criterion for the availability of an execution of the mounting operation may be previously set. In the case where both the already mounted component and the mounting object component are semiconductor devices such as BGAs, and so-called stack mounting in which a semiconductor device is mounted by the electronic component mounting apparatus 1 on a similar semiconductor device that is previously mounted by the upstream apparatus is to be performed, the determination criterion is set so that an execution of the mounting operation is disabled when the lower semiconductor device that is already mounted is positionally displaced while exceeding an allowable range, when, in the lower semiconductor device, a foreign material is detected in a connection portion to which the upper semiconductor device is to be connected, or the like.

The controlling section 28 is configured by the recognition processing section 28*a*, a failure detection processing section 28*b*, a failure pattern determination processing section 28*c*, a mounting availability determination processing section 28*d*, and a mounting control processing section 28*e*. The recognition processing section 28*a* performs an image recognition process on a result of imaging in which an image of the board 3 is taken by the recognition camera 11, to detect existence or non-existence of components on the individual boards 30 of the board 3, and positional displacement from the normal position. The failure detection processing section 28*b* refers to the positional displacement threshold data 27*a* to detect whether a failure item exists or not, based on a result of the recognition process by the recognition processing section 28*a*. The failure pattern determination processing section 28*c* determines to which one of the failure patterns defined in the failure pattern data 27*b* the failure item detected by the failure detection processing section 28*b* corresponds.

Based on the failure pattern which is determined by the failure pattern determination processing section 28*c*, the mounting availability determination processing section 28*d* determines the availability of mounting of the mounting object component onto the board 3. Namely, the mounting availability determination processing section 28d determines the availability of an execution of the operation of mounting the mounting object component by the component mounting section B, based on a result of the detection by the failure detection processing section 28b. The mounting control processing section 28e causes the component mounting mechanism 24 to execute the operation of mounting the mounting object component onto the board 3, based on a result of the determination by the mounting availability determination processing section 28d.

Next, referring to FIG. 6, an electronic component mounting process flow in which components (here, the shield cases 32A, 32B) are mounted onto the board 3 by the electronic component mounting apparatus 1 will be described. Here, performed is a process of mounting a mounting object component that is allocated to the electronic component mounting apparatus 1, i.e., the shield cases 32A, 32B, onto the board 3 is performed based on a result of checking of the state of the board 3 which is delivered from the upstream apparatus constituting the electronic component mounting line.

Figure 6:
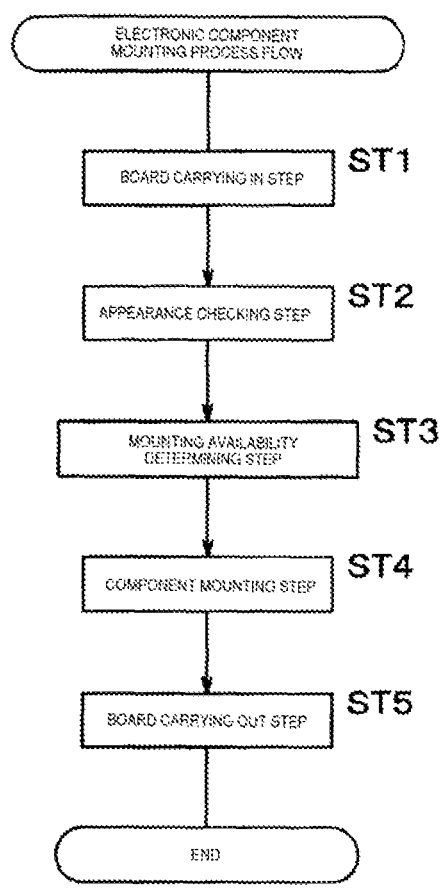
FIG. 6 is a flow chart of a component mounting process in the electronic component mounting method of the embodiment of the invention.

Referring to FIG. 6, first, a board carrying in step is executed (ST1). Namely, the delivered board 3 is transported by the transporting conveyor 2, and positioned and held at the predetermined working position. In the case where the board 3 onto which components have not been mounted is delivered, a component mounting step is executed here. Next, an appearance checking step is executed (ST2). Namely, imaged data obtained by a process in which an image of the board 3 positioned at the working position in the transporting conveyor 2 is taken by the recognition camera 11 is subjected to a recognition process by the recognition processing section 28a. Then, a result of the recognition process is compared with a failure detection criterion which is previously set, and which is stored as the failure detection criterion data 27 in the storage section 25, thereby detecting existence or non-existence of a failure item with respect to the already mounted components in the board 3, and a result of the detection is output.

Next, a mounting availability determining step is executed (ST3). Namely, based on the detection result of a failure item in the appearance checking step, the availabilities of executions of operations of mounting the shield cases 32A, 32B are individually determined. Here, in the case where the first failure pattern is detected, it is determined that executions of operations of mounting the shield cases 32A, 32B which are mounting object components in the component mounting step are available, and, in the case where the second failure pattern or the third failure pattern is detected, it is determined that an execution of an operation of mounting one of the shield cases 32A, 32B which corresponds to the failure pattern is impossible.

Next, the component mounting step is executed on the board which is positioned at the working position in the transporting conveyor 2, and in which the check in the appearance checking step has been ended (ST4). Namely, in accordance with the determination on the availability of an operation of mounting the mounting object component in the mounting availability determining step which is executed in advance of the component mounting step, the shield cases 32A, 32B are transferred and mounted by the component mounting section B. Then, the board 3 in which the component mounting step has been executed is carried out from the electronic component mounting apparatus 1 (the board carrying out step) (ST5). As a result, one cycle of the electronic component mounting process for the board 3 is ended.

In the electronic component mounting process, the board 3 which is an object of working maintains the state where the board is held at the working position that is set in the transporting conveyor 2, and the appearance check and the component mounting are executed on the board 3 in this state by the appearance checking section A and the component mounting section B, respectively. Therefore, the trouble which occurs in the prior art example having the configuration where the checking apparatus is placed upstream from the electronic component mounting apparatus, i.e., the situation where, in the transporting process in which a board which is determined by the checking apparatus that the component mounting state is good is transported downstream, positional displacement of a component is caused by vibrations, and, in the downstream electronic component mounting apparatus, a mounting object component is overlappingly mounted while the already mounted components remain in an abnormal state, to cause a mounting failure can be completely eliminated.

Moreover, the embodiment includes the mounting availability determination processing section 28d which determines an availability of an execution of the operation of mounting the mounting object component by the component mounting section B, based on the detection result of a failure item by the appearance checking section A, and the availability of the execution of the operation of mounting the mounting object component is automatically determined based on the preset failure patterns of the detection result in the mounting availability determining process, whereby an adequate component mounting work to which a check result is correctly reflected is enabled, and both reduction of the failure occurrence rate and improvement of the working efficiency can be satisfied.

In the above-described embodiment, the example in which the determination of the availability of mounting based on the detection result of a failure item by the appearance checking section A is performed on each of individual mounting object components has been described. In the case where the objective board 3 is a multi-piece board in which a plurality of individual boards 30 are assembled, when at least one of the second failure pattern and the third failure pattern is detected, it may be determined in the mounting availability determining step that the execution of the mounting operation for the mounting object component that is directed to the individual board 30 in which the failure pattern is detected is impossible, and the individual board 30 may be eliminated from the objects of the mounting operation. Furthermore, when at least one of the second failure pattern and the third failure pattern is detected, it may be determined in the mounting availability determining step that the execution of the mounting operation for the mounting object component that is directed to the whole range of the board 3 in which the failure pattern is detected is impossible, and the whole board 3 may be eliminated from the objects of the mounting operation.

The application is based on Japanese Patent Application (No. 2009-153379) filed Jun. 29, 2009, and its disclosure is incorporated herein by reference.

INDUSTRIAL APPLICABILITY

The electronic component mounting apparatus and electronic component mounting method of the invention have an effect that an adequate component mounting work to which a check result is correctly reflected is enabled, and both reduction of the failure occurrence rate and improvement of the working efficiency can be satisfied, and are useful in the field where electronic components are mounted onto a board by an electronic component mounting line configured by coupling a plurality of electronic component mounting apparatuses to each other.

DESCRIPTION OF REFERENCE NUMERALS AND SIGNS 1 electronic component mounting apparatus
2 transporting conveyor
3 board
4 component supplying section
10 mounting head
11 recognition camera
A appearance checking section
B component mounting section
30 individual board
30a, 30b shield area
31A, 31B, 31C already mounted component
32A, 32B shield case
33 foreign material

The invention claimed is:

1. An electronic component mounting apparatus which mounts electronic components and shielding cases on a board based on a result of a check of a state of the board, wherein at least some of the electronic components are located in shield areas where the shielding cases are mounted to at least partially cover an upper side of the some of the electronic components, wherein
the apparatus includes:
a board transporting mechanism which transports the board to position and hold the board at a predetermined working position;
an appearance checking section that compares a recognition process result to a preset failure detection criterion to detect existence or non-existence of a failure item in the board, the recognition process result is obtained by performing a recognition process on imaged data, the imaged data obtained by taking an image of the board while the board is positioned at the working position, and the appearance checking section outputs a result of the comparison;
a component mounting section which transfers and mounts an electronic component and a shielding case allocated to the electronic component mounting apparatus onto the board which is positioned at the working position, and in which the check by the appearance checking section is ended; and
a mounting availability determining section which determines whether or not it is possible to execute an operation of mounting the electronic component by the component mounting section, based on the detection result,
the failure item includes: a first failure pattern which, corresponds to a case where an electronic component that should be mounted on the board is missing in an area other than the one or more shield areas or an electronic component located in an area other than the one or more shield areas is positionally displaced from a normal position beyond an allowable range;
a second failure pattern which corresponds to a case where an electronic component that should be mounted on the board is missing in the one or more shield areas or an electronic component located in the one or more shield areas is positionally displaced from the normal position beyond the allowable range; and
a third failure pattern which corresponds to a case where a foreign material that disturbs an operation of mounting the electronic component exists in the one or more shield areas, and,
when the first failure pattern is detected, the mounting availability determining section determines that it is possible to execute the mounting operation for the shielding case by the component mounting section, and,
when the second failure pattern or the third failure pattern is detected, the mounting availability determining section determines that it is impossible to execute the mounting operation for the shielding case by the component mounting section.

* * * * *